US008903565B2

(12) United States Patent
Eckberg et al.

(10) Patent No.: US 8,903,565 B2
(45) Date of Patent: Dec. 2, 2014

(54) OPERATING EFFICIENCY OF A REAR DOOR HEAT EXCHANGER

(75) Inventors: Eric A. Eckberg, Rochester, MN (US); Howard V. Mahaney, Jr., Cedar Park, TX (US); William M. Megarity, Roxboro, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 405 days.

(21) Appl. No.: 13/332,906

(22) Filed: Dec. 21, 2011

(65) Prior Publication Data

US 2013/0166094 A1    Jun. 27, 2013

(51) Int. Cl.
    G05D 23/00    (2006.01)
    G05B 13/00    (2006.01)
    G05B 15/00    (2006.01)
    F24F 7/00     (2006.01)
    G06F 1/20     (2006.01)
    H05K 7/20     (2006.01)

(52) U.S. Cl.
    USPC ............ 700/300; 700/276; 165/59; 236/49.3; 361/679.46; 361/688

(58) Field of Classification Search
    CPC ... F24F 7/013; F24F 11/0009; F24F 11/0012; F24F 11/006; F24F 11/0086; F24F 2011/0091
    USPC ................. 700/275, 276, 286, 297, 299, 300; 165/58, 59; 236/49.1, 49.3; 361/600, 361/679.01, 679.02, 679.46, 688
    See application file for complete search history.

(56) References Cited

U.S. PATENT DOCUMENTS

| 5,810,244 | A   | * | 9/1998  | Ngai ........................ 236/44 C |
| 6,347,748 | B1  |   | 2/2002  | Lyons |
| 6,973,958 | B1  |   | 12/2005 | Chou |
| 7,170,745 | B2  |   | 1/2007  | Bash et al. |
| 7,203,063 | B2  |   | 4/2007  | Bash et al. |
| 7,447,022 | B2  |   | 11/2008 | Murakami et al. |
| 7,826,215 | B2  |   | 11/2010 | Glover et al. |
| 7,983,540 | B2  |   | 7/2011  | Arnold et al. |
| 8,327,656 | B2  | * | 12/2012 | Tutunoglu et al. ........... 62/259.2 |
| 8,543,244 | B2  | * | 9/2013  | Keeling et al. ............... 700/276 |
| 2008/0127965 | A1 | * | 6/2008 | Burton ......................... 126/628 |
| 2010/0071637 | A1 |   | 3/2010 | Shintani et al. |
| 2011/0121599 | A1 | * | 5/2011 | Goupil et al. ............. 296/37.12 |

OTHER PUBLICATIONS

"Air Eliminators, Air Separators, Air Scoops and Dirt Separators From Taco, Caleffi, Cash Acme and Spirovent for Radiant Heat, Hydronic Heat, Cooling Systems and Solar Heat Applications", www.houseneeds.com [online] 2000, [accessed online Oct. 28, 2011], 4 pp., URL:http://www.houseneeds.com/shop/HeatingProducts/HydronicHeating/aireliminatorindex.asp.

* cited by examiner

*Primary Examiner* — Crystal J Barnes-Bullock
(74) *Attorney, Agent, or Firm* — Edward J. Lenart; Katherine S. Brown; Biggers Kennedy Lenart Spraggins LLP

(57) ABSTRACT

Improving the operating efficiency of a rear door heat exchanger, including: determining, by a ventilation management module, a temperature differential between two temperature sensors in the rear door heat exchanger, the temperature differential indicative of cooling efficiency in the rear door heat exchanger; determining, by the ventilation management module, whether the temperature differential is greater than a predetermined threshold; and responsive to determining that the temperature differential is greater than the predetermined threshold, taking corrective action by the ventilation management module.

25 Claims, 5 Drawing Sheets

OPERATING EFFICIENCY OF A REAR DOOR HEAT EXCHANGER

BACKGROUND OF THE INVENTION

1. Field of the Invention

The field of the invention is data processing, or, more specifically, methods, apparatus, and products for improving the operating efficiency of a rear door heat exchanger.

2. Description of Related Art

A rear door heat exchanger consists of a vertical supply manifold, a vertical return manifold, and a number of horizontal tubes which run from the supply manifold to the return manifold. Cold water flows into the supply manifold, through the horizontal tubes, and is collected in the return manifold. Warm exhaust air from computing components that are near the rear door heat exchanger flows across the horizontal tubes and heat is removed from the hot air stream, thereby lowering the air temperature as heat from the hot air stream is transferred to the relatively cooler water flow. Heat exchanger efficiency is adversely impacted if air becomes trapped in the heat exchanger. Typically, air naturally accumulates at the highest point in the heat exchanger.

SUMMARY OF THE INVENTION

Methods, apparatus, and products for improving the operating efficiency of a rear door heat exchanger, including: determining, by a ventilation management module, a temperature differential between two temperature sensors in the rear door heat exchanger, the temperature differential indicative of cooling efficiency in the rear door heat exchanger; determining, by the ventilation management module, whether the temperature differential is greater than a predetermined threshold; and responsive to determining that the temperature differential is greater than the predetermined threshold, taking corrective action by the ventilation management module.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
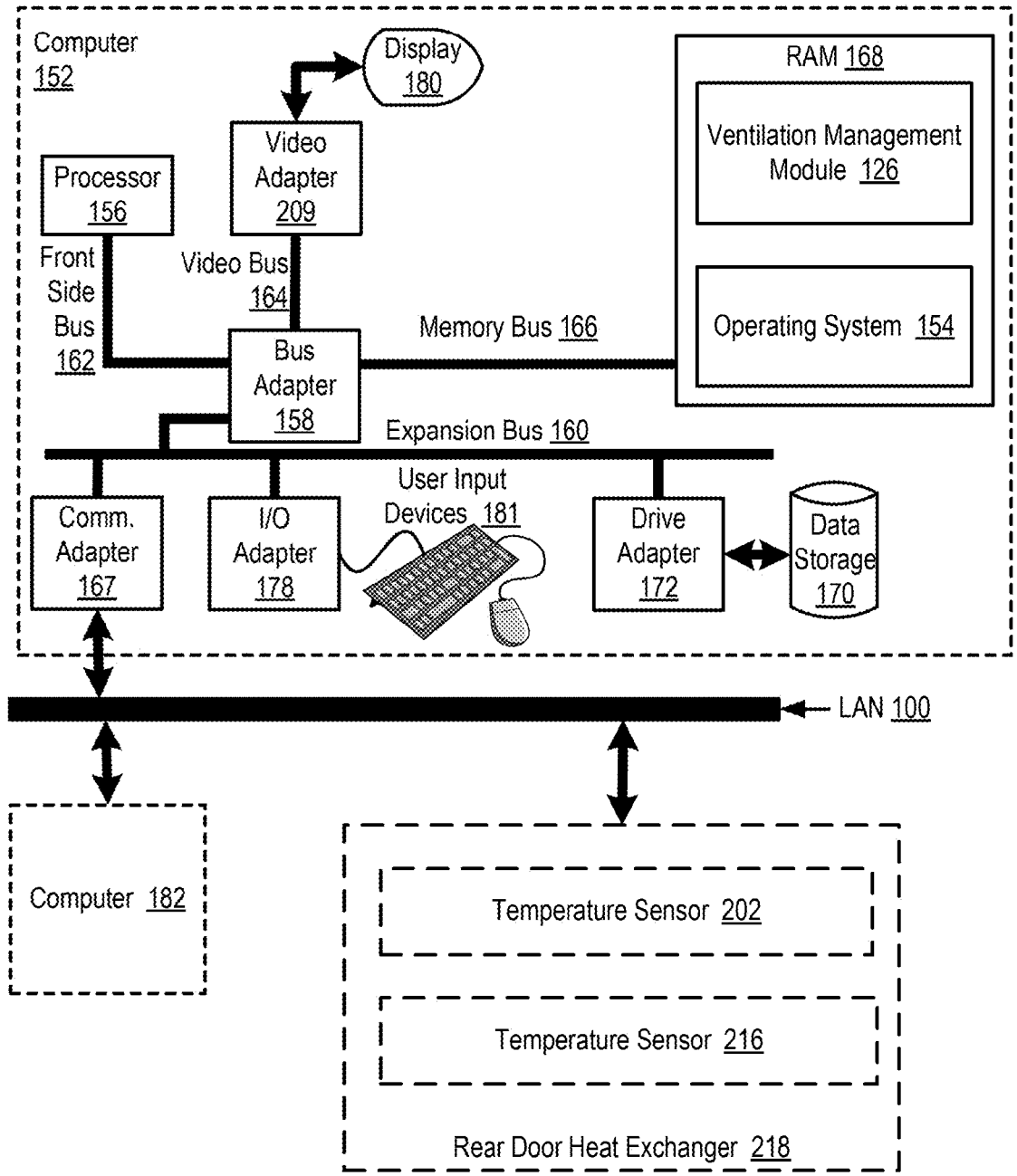
FIG. 1 sets forth a block diagram of automated computing machinery comprising an example computer useful in improving the operating efficiency of a rear door heat exchanger according to embodiments of the present invention.

Example methods, apparatus, and products for improving the operating efficiency of a rear door heat exchanger in accordance with the present invention are described with reference to the accompanying drawings, beginning with FIG. 1. FIG. 1 sets forth a block diagram of automated computing machinery comprising an example computer (152) useful in improving the operating efficiency of a rear door heat exchanger according to embodiments of the present invention. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is a ventilation management module (126), a module of computer program instructions for improving the operating efficiency of a rear door heat exchanger (218) according to embodiments of the present invention. The rear door heat exchanger (218) of FIG. 1 is machinery for removing heat from a rack of computing devices such as, for example, a rack of blade servers. A rear door heat exchanger (218) can include a vertical supply manifold, a vertical return manifold, and a number of horizontal tubes which run from the supply manifold to the return manifold. Cold water can flow into the supply manifold and flow through the horizontal tubes before being collected in the return manifold. The rear door heat exchanger (218) may be position proximate to a rack of computing devices such that warm air exits the computing devices and flows across the horizontal tubes that cool water is passing through. Heat may therefore be removed from the rack of computing components as heat is removed from the hot air stream exiting from the computing components within the rack, thereby lowering the air temperature leaving the rack of computing components. Heat from the hot air stream that is exiting from the computing components within the rack may be transferred to the relatively cooler water flow to remove heat from the rack of computing components.

Modern rear door heat exchangers (218) can suffer performance degradations as air can become trapped at the highest point in the rear door heat exchanger (218). Air can be introduced into the rear door heat exchanger (218), for example, when the rear door heat exchanger (218) is filled with liquid that is to be circulated throughout the rear door heat exchanger (218). Furthermore, air can also be introduced into the rear door heat exchanger (218) as the liquid that circulates throughout the rear door heat exchanger (218) may include trapped gases or may release gases when heat is applied to the liquid. As air becomes trapped in the highest point in the rear door heat exchanger (218), liquid ceases to flow through the highest point in the rear door heat exchanger (218) and, as such, heat is not removed from the exhaust air from the computing components that are near the highest point in the rear door heat exchanger (218) as there is no liquid to receive the heat and transfer the heat out of the computing system.

The ventilation management module (126) of FIG. 1 can carry out improving the operating efficiency of a rear door heat exchanger (218) according to embodiments of the present invention by determining an upper level air temperature (204). The upper level air temperature (204) represents the air temperature measured by a temperature sensor (202) located by the upper portion of the rear door heat exchanger (218). The upper portion of the rear door heat exchanger (218) represents the portion of the rear door heat exchanger (218) that is furthest away from the ground. The upper portion of the rear door heat exchanger (218) may be defined as being any portion of the rear door heat exchanger (218) that is above a specific horizontal tube for carrying water, as any portion of the rear door heat exchanger (218) that is above a horizontal tube for carrying water that is furthest away from the ground, and so on. In the example of FIG. 1, the temperature sensor (202) is mounted on or near the exhaust side of the rear door heat exchanger (218). Such a temperature sensor (202) may be configured to provide the upper level air temperature (204) to the ventilation management module (126) or, alternatively, the ventilation management module (126) may be configured to read the upper level air temperature (204) from the temperature sensor (202).

The ventilation management module (126) of FIG. 1 can further carry out improving the operating efficiency of a rear door heat exchanger (218) according to embodiments of the present invention by determining a lower level air temperature (214). The lower portion of the rear door heat exchanger (218) represents the portion of the rear door heat exchanger (218) that is closest to the ground. The lower portion of the rear door heat exchanger (218) may be defined as being any portion of the rear door heat exchanger (218) that is lower than a specific horizontal tube for carrying water, as any portion of the rear door heat exchanger (218) that is below a horizontal tube for carrying water that is closest to the ground, and so on. In the example of FIG. 1, the temperature sensor (216) is mounted on or near the exhaust side of the rear door heat exchanger (218). Such a temperature sensor (216) may be configured to provide the lower level air temperature (214) to the ventilation management module (126) or, alternatively, the ventilation management module (126) may be configured to read the lower level air temperature (214) from the temperature sensor (216).

The ventilation management module (126) of FIG. 1 can further carry out improving the operating efficiency of a rear door heat exchanger (218) according to embodiments of the present invention by determining whether a difference in the upper level air temperature (204) and the lower level air temperature (214) is greater than a predetermined threshold. In the example of FIG. 1, the predetermined threshold represents a difference in temperature between air exiting the upper level of rear door heat exchanger (218) and air exiting the lower level of rear door heat exchanger (218) that may be indicative of a problem with the rear door heat exchanger (218), such as air trapped in the upper portion of the rear door heat exchanger (218). In such an example, the predetermined threshold may be set, for example, by a system administrator, by a manufacturer of the rear door heat exchanger (218), and so on. Determining whether a difference in the upper level air temperature (204) and the lower level air temperature (214) is greater than a predetermined threshold may be carried out, for example, by subtracting the lower level air temperature (214) from the upper level air temperature (204) and comparing the result of the subtraction to the predetermined threshold.

The ventilation management module (126) of FIG. 1 can carry out improving the operating efficiency of a rear door heat exchanger (218) according to embodiments of the present invention by, responsive to determining that the difference in the upper level air temperature (204) and the lower level air temperature (214) is greater than the predetermined threshold, taking corrective action by the ventilation management module (126). Corrective action represents an action initiated by the ventilation management module (126) that attempts to increase the efficiency of the rear door heat exchanger (218). Such corrective actions may include, for example, initiating an operation designed to remove air that is trapped in the upper portion of the rear door heat exchanger (218).

Also stored in RAM (168) is an operating system (154). Operating systems useful for improving the operating efficiency of a rear door heat exchanger (218) according to embodiments of the present invention include UNIX™, Linux™, Microsoft XP™, AIX™, IBM's i5/OS™, and others as will occur to those of skill in the art. The operating system (154) and the ventilation management module (126) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for improving the operating efficiency of a rear door heat exchanger (218) according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182), with a communications adapter coupled to the rear door heat exchanger (218), and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for improving the operating efficiency of a rear door heat exchanger according to embodiments of the present invention include modems for wired dial-up communications, Ethernet (IEEE 802.3) adapters for wired data communications network communications, and 802.11 adapters for wireless data communications network communications.

Figure 2:
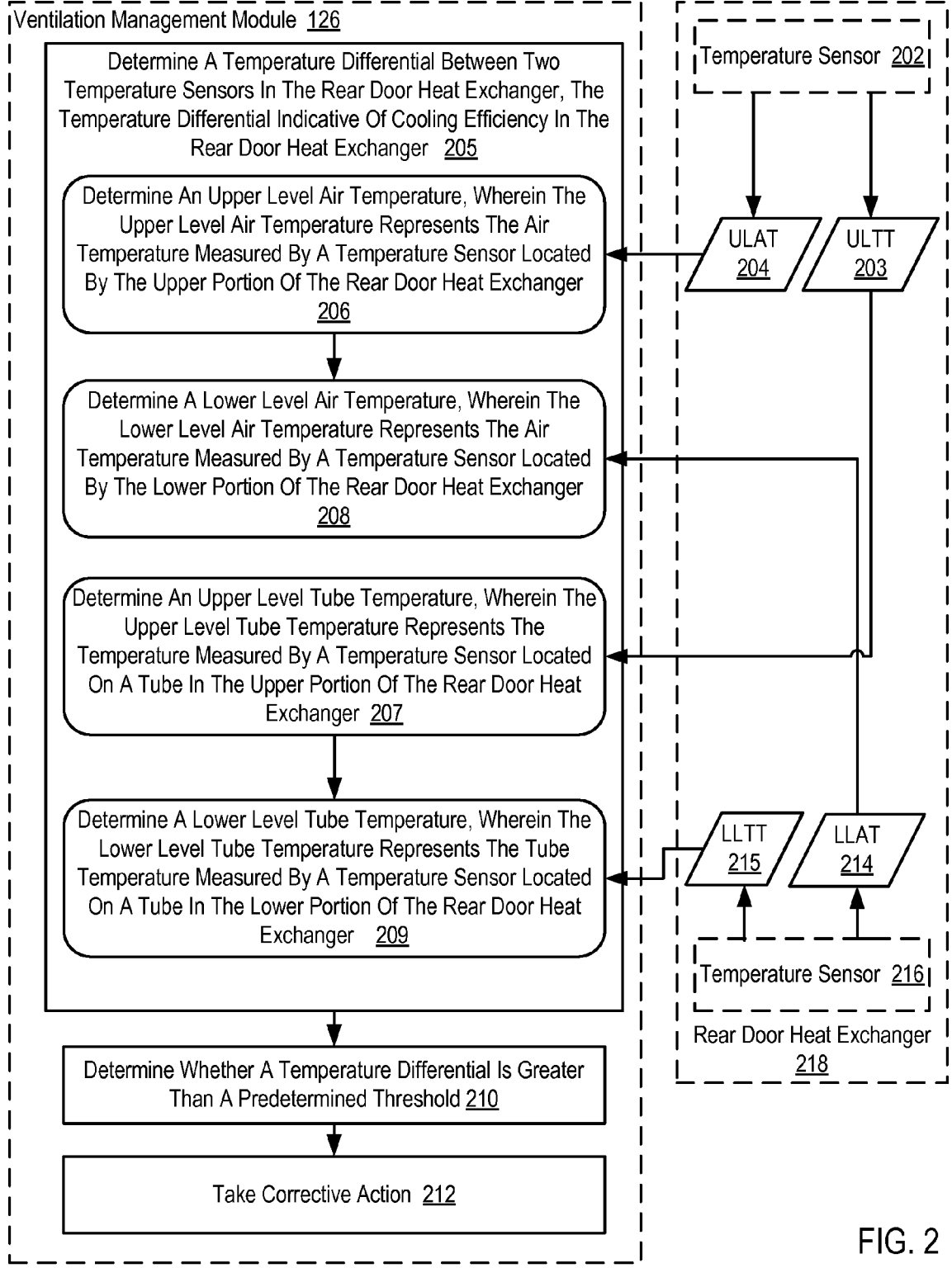
FIG. 2 sets forth a flow chart illustrating an example method for improving the operating efficiency of a rear door heat exchanger according to embodiments of the present invention.

For further explanation, FIG. 2 sets forth a flow chart illustrating an example method for improving the operating efficiency of a rear door heat exchanger (218) according to embodiments of the present invention. In the example method of FIG. 2, the rear door heat exchanger (218) is machinery for removing heat from a rack of computing devices such as, for example, a rack of blade servers. A rear door heat exchanger (218) can include a vertical supply manifold, a vertical return manifold, and a number of horizontal tubes which run from the supply manifold to the return manifold. Cold water can flow into the supply manifold and flow through the horizontal tubes before being collected in the return manifold. The rear door heat exchanger (218) may be positioned proximate to a rack of computing devices such that warm air exits the computing devices and flows across the horizontal tubes that cool water is passing through. Heat may therefore be removed from the rack of computing components as heat is removed from the hot air stream exiting from the computing components within the rack, thereby lowering the air temperature exhausting from the rack of computing components. Heat from the hot air stream that is exiting from the computing components within the rack may be transferred to the relatively cooler water flow to remove heat from the rack of computing components.

Modern rear door heat exchangers (218) can suffer performance degradations as air can become trapped at the highest point in the rear door heat exchanger (218). Air can be introduced into the rear door heat exchanger (218), for example, when the rear door heat exchanger (218) is filled with liquid that is to be circulated throughout the rear door heat exchanger (218). Furthermore, air can also be introduced into the rear door heat exchanger (218) as the liquid that circulates throughout the rear door heat exchanger (218) may include trapped gases or may release gases when heat is applied to the liquid. As air becomes trapped in the highest point in the rear door heat exchanger (218), liquid ceases to flow through the highest point in the rear door heat exchanger (218) and, as such, heat is removed from computing components that are near the highest point in the rear door heat exchanger (218) as there is no liquid to receive the heat and transfer the heat out of the computing system.

The example method of FIG. 2 includes determining (205), by a ventilation management module (126), a temperature differential between two temperature sensors (202, 216) in the rear door heat exchanger (218). The temperature differential of FIG. 2 is indicative of cooling efficiency in the rear door heat exchanger (218). For example, a large temperature differential may indicate that particular parts of the rear door heat exchanger (218) may be functioning inefficiently relative to other parts of the rear door heat exchanger (218). In the example method of FIG. 2, the ventilation management module (126) is module of computer program instructions that, when executed, manage the operations of a rear door heat exchanger (218). The ventilation management module (126) may be configured to receive data from temperature sensors (202, 216) to detect conditions in which air has become trapped in the highest point in the rear door heat exchanger (218) and to respond to the detection of such a condition.

In the example method of FIG. 2, determining (205) a temperature differential between two temperature sensors (202, 216) in the rear door heat exchanger (218) may be carried out by determining (206), by a ventilation management module (126), an upper level air temperature (204). In the example method of FIG. 2, the upper level air temperature (204) represents the air temperature measured by a temperature sensor (202) located by the upper portion of the rear door heat exchanger (218). The upper portion of the rear door heat exchanger (218) represents the portion of the rear door heat exchanger (218) that is furthest away from the ground. The upper portion of the rear door heat exchanger (218) may be defined as being any portion of the rear door heat exchanger (218) that is above a specific horizontal tube for carrying water, as any portion of the rear door heat exchanger (218) that is above a horizontal tube for carrying water that is furthest away from the ground, and so on. In the example of FIG. 2, the temperature sensor (202) may be mounted on or near the exhaust side of the rear door heat exchanger (218). Such a temperature sensor (202) may be configured to provide the upper level air temperature (204) to the ventilation management module (126) or, alternatively, the ventilation management module (126) may be configured to read the upper level air temperature (204) from the temperature sensor (202).

In the example method of FIG. 2, determining (205) a temperature differential between two temperature sensors (202, 216) in the rear door heat exchanger (218) may further be carried out by determining (208), by the ventilation management module (126), a lower level air temperature (214). In the example of FIG. 2, the lower portion of the rear door heat exchanger (218) represents the portion of the rear door heat exchanger (218) that is closest to the ground. The lower portion of the rear door heat exchanger (218) may be defined as being any portion of the rear door heat exchanger (218) that is lower than a specific horizontal tube for carrying water, as any portion of the rear door heat exchanger (218) that is below a horizontal tube for carrying water that is closest to the ground, and so on. In the example of FIG. 2, the temperature sensor (216) is mounted on or near the exhaust side of the rear door heat exchanger (218). Such a temperature sensor (216) may be configured to provide the lower level air temperature (214) to the ventilation management module (126) or, alternatively, the ventilation management module (126) may be configured to read the lower level air temperature (214) from the temperature sensor (216). In the example method of FIG. 2, determining (205) a temperature differential between two temperature sensors (202, 216) in the rear door heat exchanger (218) may therefore be carried out by subtracting the lower level air temperature (214) from the upper level air temperature (204) to determine the difference between the lower level air temperature (214) and the upper level air temperature (204).

In the example method of FIG. 2, determining (205) a temperature differential between two temperature sensors (202, 216) in the rear door heat exchanger (218) may be alternatively be carried out by determining (207), by the ventilation management module (126), an upper level tube temperature (203). As described above, a rear door heat exchanger (218) includes a plurality of water carrying tubes that run horizontal to the ground. In the example method of FIG. 2, the upper level tube temperature (203) represents the temperature measured by a temperature sensor (202) located on a tube in the upper portion of the rear door heat exchanger (218). The upper portion of the rear door heat exchanger (218) represents the portion of the rear door heat exchanger (218) that is furthest away from the ground. The upper portion of the rear door heat exchanger (218) may be defined as being any portion of the rear door heat exchanger (218) that is above a specific horizontal tube for carrying water, as any portion of the rear door heat exchanger (218) that is at or above a horizontal tube for carrying water that is furthest away from the ground, and so on. In the example of FIG. 2, the temperature sensor (202) may be mounted on a tube, such as the uppermost tube, of rear door heat exchanger (218). Such a temperature sensor (202) may be configured to provide the upper level tube temperature (203) to the ventilation management module (126) or, alternatively, the ventilation management module (126) may be configured to read the upper level tube temperature (203) from the temperature sensor (202).

In the example method of FIG. 2, determining (205) a temperature differential between two temperature sensors (202, 216) in the rear door heat exchanger (218) can also be carried out by determining (209), by the ventilation management module (126), a lower level tube temperature (215). In the example method of FIG. 2, the lower level tube temperature (215) represents the tube temperature measured by a temperature sensor (216) located on a tube in the lower portion of the rear door heat exchanger (218). In the example of FIG. 2, the lower portion of the rear door heat exchanger (218) represents the portion of the rear door heat exchanger (218) that is closest to the ground. The lower portion of the rear door heat exchanger (218) may be defined as being any portion of the rear door heat exchanger (218) that is lower than a specific horizontal tube for carrying water, as any portion of the rear door heat exchanger (218) that is at or below a horizontal tube for carrying water that is closest to the ground, and so on. In the example of FIG. 2, the temperature sensor (216) is mounted on a tube in the rear door heat exchanger (218). Such a temperature sensor (216) may be configured to provide the lower level tube temperature (215) to the ventilation management module (126) or, alternatively, the ventilation management module (126) may be configured to read the lower level tube temperature (215) from the temperature sensor (216). In the example method of FIG. 2, determining (205) a temperature differential between two temperature sensors (202, 216) in the rear door heat exchanger (218) may therefore be carried out by subtracting the lower level tube temperature (215) from the upper level tube temperature (203) to determine the difference between the lower level tube temperature (215) and the upper level tube temperature (203).

The example method of FIG. 2 also includes determining (210), by the ventilation management module (126), whether a temperature differential is greater than a predetermined threshold. In the example method of FIG. 2, the predetermined threshold may represent a difference in temperature between air exiting the upper level of rear door heat exchanger (218) and air exiting the lower level of rear door heat exchanger (218) that may be indicative of a problem with the rear door heat exchanger (218), such as air trapped in the upper portion of the rear door heat exchanger (218). Alternatively, the predetermined threshold may represent a difference in temperature between a tube in the upper level of the rear door heat exchanger (218) and a tube in the lower level of the rear door heat exchanger (218) that may be indicative of a problem with the rear door heat exchanger (218), such as air trapped in the upper portion of the rear door heat exchanger (218). In such an example, the predetermined threshold may be set, for example, by a system administrator, by a manufacturer of the rear door heat exchanger (218), and so on.

The example method of FIG. 2 includes, responsive to determining that the temperature differential is greater than the predetermined threshold, taking (212) corrective action by the ventilation management module (126). In the example method of FIG. 2, corrective action represents an action initiated by the ventilation management module (126) that attempts to increase the efficiency of the rear door heat exchanger (218). Such corrective actions may include, for example, initiating an operation designed to remove air that is trapped in the upper portion of the rear door heat exchanger (218).

Figure 3:
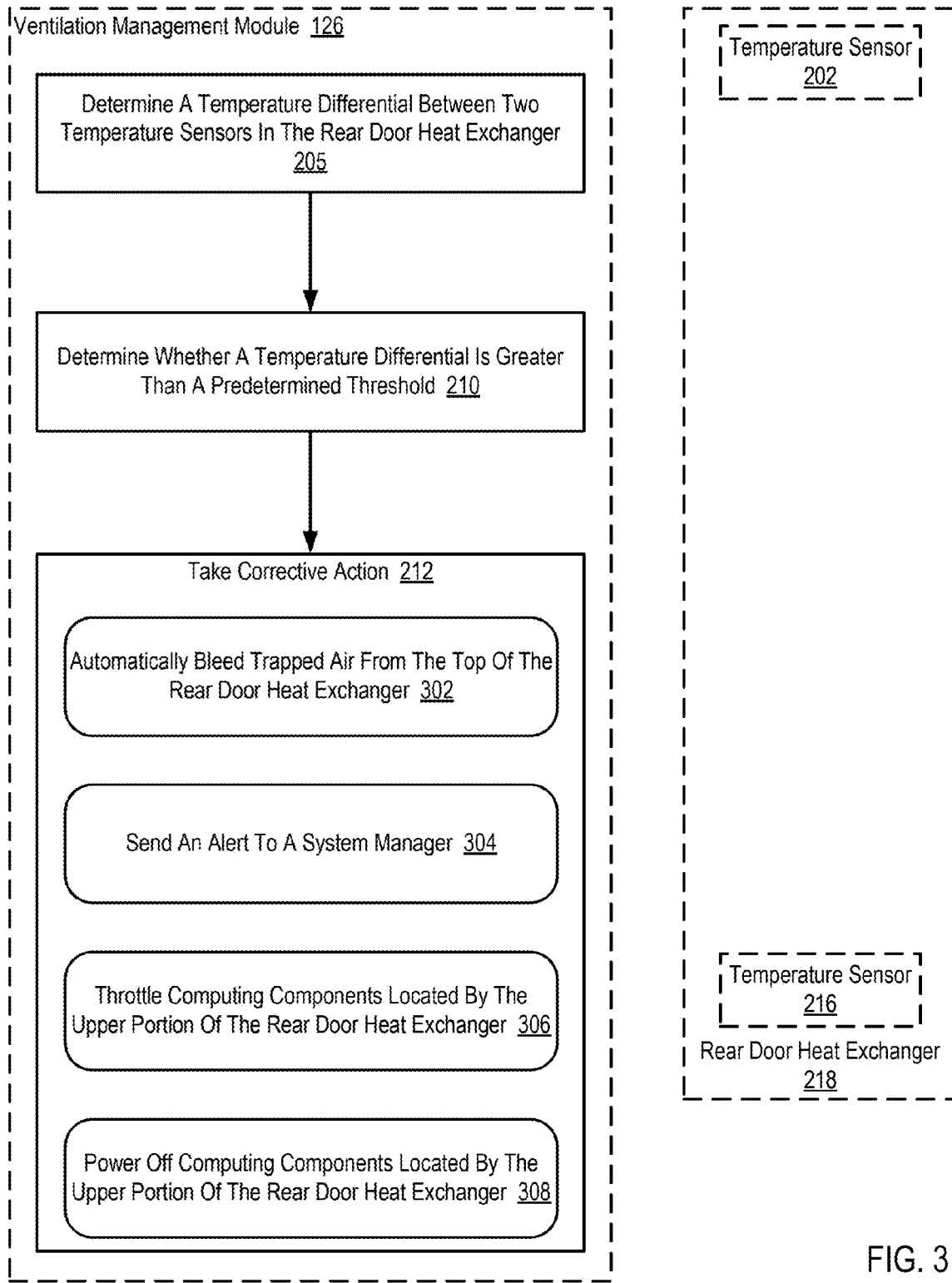
FIG. 3 sets forth a flow chart illustrating a further example method for improving the operating efficiency of a rear door heat exchanger according to embodiments of the present invention.

For further explanation, FIG. 3 sets forth a flow chart illustrating a further example method for improving the operating efficiency of a rear door heat exchanger (218) according to embodiments of the present invention. The example method of FIG. 3 is similar to the method of FIG. 2, as it also includes determining (205) a temperature differential between two temperature sensors (202, 216) in the rear door heat exchanger (218), determining (210) whether the temperature differential is greater than a predetermined threshold, and responsive to determining that the temperature differential is greater than the predetermined threshold, taking (212) corrective action by the ventilation management module (126).

In the example method of FIG. 3, taking (212) corrective action by the ventilation management module (126) can include automatically (302) bleeding trapped air from the top of the rear door heat exchanger (218). In the example method of FIG. 3, automatically (302) bleeding trapped air from the top of the rear door heat exchanger (218) may be carried out, for example, through the use of a valve or other opening that may be located at the top of the rear door heat exchanger (218) to allow air to be removed from the rear door heat exchanger (218). In such an example, the ventilation management module (126) can include computer program instructions that, when executed, control the operation of the valve or other release mechanism such that the ventilation management module (126) can open the valve or other release mechanism to release trapped air from the rear door heat exchanger (218).

In the example method of FIG. 3, taking (212) corrective action by the ventilation management module (126) can alternatively include sending (304) an alert to a system manager. In the example method of FIG. 3, the system manager may be a person responsible for managing a computing system or, alternatively, an automated software application executing on a physical machine that is configured to manage the computing system. In the example of FIG. 3, sending (304) an alert to a system manager may therefore be carried out by sending an alert to an email address associated with the system manager, sending a message to a phone number associated with the system manager, sending a message to a message receiving interface of a software application that operates as the system manager, and so on.

In the example method of FIG. 3, taking (212) corrective action by the ventilation management module (126) can alternatively include throttling (306) computing components located by the upper portion of the rear door heat exchanger (218). Consider an example in which the rear door heat exchanger (218) is removing heat from a rack of blade servers. When the difference in the upper level air temperature (204) and the lower level air temperature (214) is greater than a predetermined threshold, thereby indicating a condition such as trapped air within the top portion of the rear door heat exchanger (218), the top portion of the rear door heat exchanger (218) may not be removing a sufficient amount of heat from those computing components in the top portion of the rack of blade servers. As such, computing components located by the upper portion of the rear door heat exchanger (218) may be throttled (306) down so that the computing components located by the upper portion of the rear door heat exchanger (218) are not generating as much heat. In the example of FIG. 3, throttling (306) computing components located by the upper portion of the rear door heat exchanger (218) can include, for example, reducing clock speeds at which CPUs in the blade servers may operate, load balancing in such a way that a higher portion of the workload is given to blade servers in the lower portion of the rack, and so on.

In the example method of FIG. 3, taking (212) corrective action by the ventilation management module (126) can alternatively include powering (308) off computing components located by the upper portion of the rear door heat exchanger (218).

Consider an example in which the rear door heat exchanger (218) is removing heat from a rack of blade servers. When the difference in the upper level air temperature (204) and the lower level air temperature (214) is greater than a predetermined threshold, thereby indicating a condition such as trapped air within the top portion of the rear door heat exchanger (218), the top portion of the rear door heat exchanger (218) may not be removing a sufficient amount of heat from those computing components in the top portion of the rack of blade servers. As such, computing components located by the upper portion of the rear door heat exchanger (218) may be powered (308) off completely so that the computing components located by the upper portion of the rear door heat exchanger (218) are not any generating heat.

Figure 4:
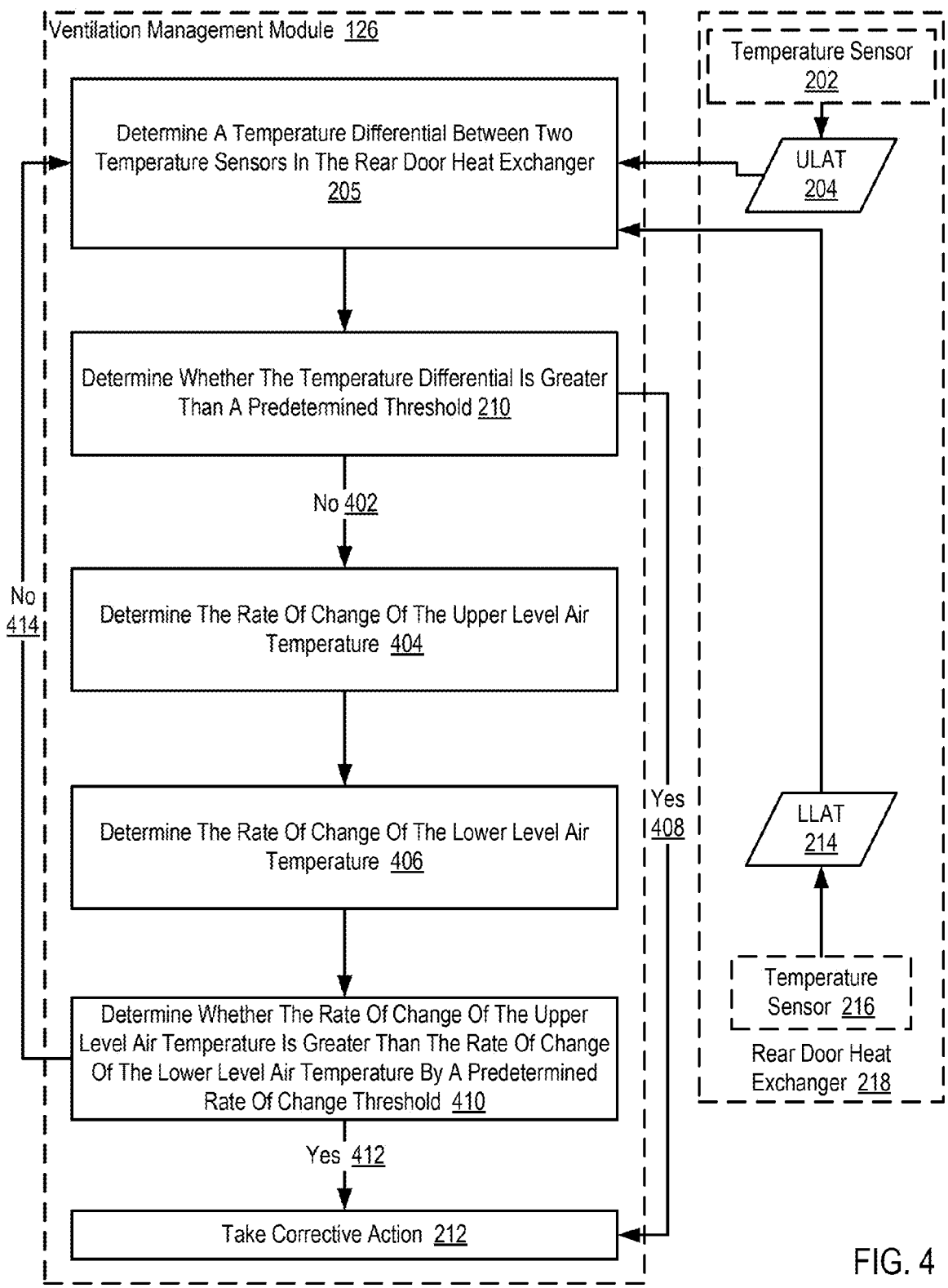
FIG. 4 sets forth a flow chart illustrating a further example method for improving the operating efficiency of a rear door heat exchanger according to embodiments of the present invention.

For further explanation, FIG. 4 sets forth a flow chart illustrating a further example method for improving the operating efficiency of a rear door heat exchanger (218) according to embodiments of the present invention. The example method of FIG. 4 is similar to the method of FIG. 2, as it also includes determining (205) a temperature differential between two temperature sensors (202, 216) in the rear door heat exchanger (218), determining (210) whether the temperature differential is greater than a predetermined threshold, and responsive to determining that the temperature differential is greater than the predetermined threshold, taking (212) corrective action by the ventilation management module (126).

In the example method of FIG. 4, corrective action is taken (212) in response to determining that the difference in the upper level air temperature (204) and the lower level air temperature (214) is (408) greater than the predetermined threshold. In the example method of FIG. 4, if the difference in the upper level air temperature (204) and the lower level air temperature (214) is not (402) greater than the predetermined threshold, the example method of FIG. 4 can include determining (404) the rate of change of the upper level air temperature (204). In the example method of FIG. 4, the rate of change of the upper level air temperature (204) represents the rate at which the upper level air temperature (204) is changing as a function of time. Determining (404) the rate of change in the upper level air temperature (204) may therefore be carried out by measuring the upper level air temperature (204) at one point in time, measuring the upper level air temperature (204) at a second point in time, and dividing the change in the upper level air temperature (204) that was measured at the two points in time by the amount of time that elapsed between each measurement.

The example method of FIG. 4 can also include determining (406) the rate of change of the lower level air temperature (214). In the example method of FIG. 4, the rate of change of the lower level air temperature (214) represents the rate at which the lower level air temperature (214) is changing as a function of time. Determining (406) the rate of change in the lower level air temperature (214) may therefore be carried out by measuring the lower level air temperature (214) at one point in time, measuring the lower level air temperature (214) at a second point in time, and dividing the change in the lower level air temperature (214) that was measured at the two points in time by the amount of time that elapsed between each measurement.

The example method of FIG. 4 can also include determining (410) whether the rate of change of the upper level air temperature (204) is greater than the rate of change of the lower level air temperature (214) by a predetermined rate of change threshold. In the example method of FIG. 4, the predetermined rate of change threshold represents a maximum amount of increase in the upper level air temperature (204) relative to the amount of increase in the lower level air temperature (214). In the example method of FIG. 4, determining (410) whether the rate of change of the upper level air temperature (204) is greater than the rate of change of the lower level air temperature (214) by a predetermined rate of change threshold may be useful for predicting that the disparity between the upper level air temperature (204) and the lower level air temperature (214) is heading towards an unacceptable level, even if the disparity between the upper level air temperature (204) and the lower level air temperature (214) is not yet at an unacceptable level.

The example method of FIG. 4 can also include, responsive to determining that the rate of change of the upper level air temperature (204) is (412) greater than the rate of change of the lower level air temperature (214) by at least the predetermined rate of change threshold, taking (212) corrective action by the ventilation management module (126). In the example method of FIG. 4, corrective action represents an action initiated by the ventilation management module (126) that attempts to increase the efficiency of the rear door heat exchanger (218), reduce the impact of higher temperatures experienced by computing components that are proximate to the rear door heat exchanger (218), and so on. Such corrective actions may include, for example, initiating an operation designed to remove air that is trapped in the upper portion of the rear door heat exchanger (218). In the example method of FIG. 4, corrective action may be taken (212) to preemptively prevent the disparity between the upper level air temperature (204) and the lower level air temperature (214) from reaching an unacceptable level. In the example method of FIG. 4, however, if the rate of change of the upper level air temperature (204) is not (414) greater than the rate of change of the lower level air temperature (214) by at least the predetermined rate of change threshold, the ventilation management module (126) does not take corrective action.

Figure 5:
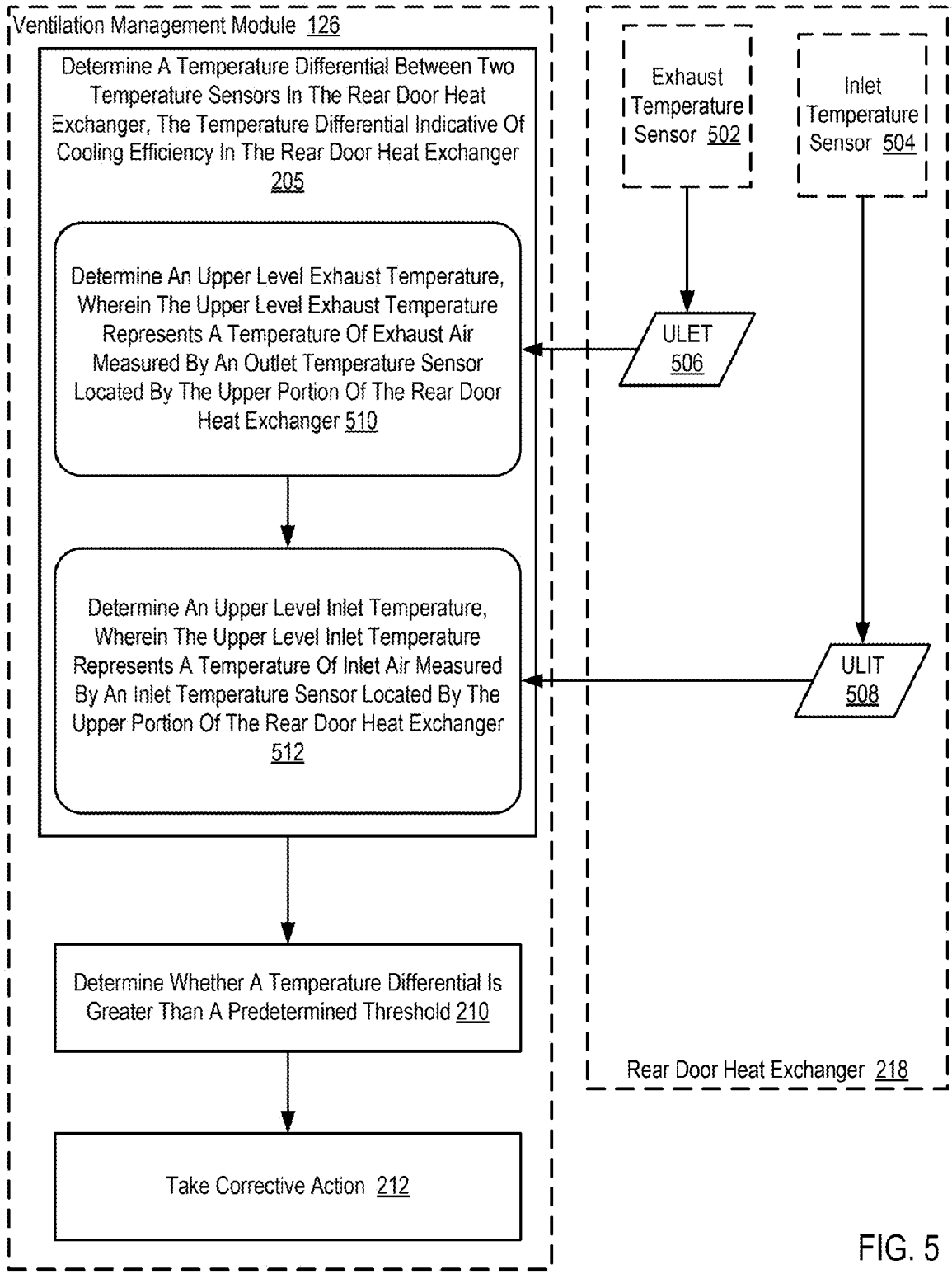
FIG. 5 sets forth a flow chart illustrating a further example method for improving the operating efficiency of a rear door heat exchanger according to embodiments of the present invention.

For further explanation, FIG. 5 sets forth a flow chart illustrating a further example method for improving the operating efficiency of a rear door heat exchanger (218) according to embodiments of the present invention. The example method of FIG. 5 is similar to the method of FIG. 2, as it also includes determining (205) a temperature differential between two temperature sensors (202, 216) in the rear door heat exchanger (218), determining (210) whether the temperature differential is greater than a predetermined threshold, and responsive to determining that the temperature differential is greater than the predetermined threshold, taking (212) corrective action by the ventilation management module (126).

In the example method of FIG. 5, determining (205) a temperature differential between two temperature sensors (202, 216) in the rear door heat exchanger (218) can include determining (510), by the ventilation management module (126), an upper level exhaust temperature (506). In the example method of FIG. 5, the upper level exhaust temperature (506) represents a temperature of exhaust air measured by an outlet temperature sensor (502) located by the upper portion of the rear door heat exchanger (218). In the example method of FIG. 5, the exhaust air represents air that has already been passed though the rear door heat exchanger (218).

In the example method of FIG. 5, determining (205) a temperature differential between two temperature sensors (202, 216) in the rear door heat exchanger (218) can also include determining (512), by the ventilation management module (126), an upper level inlet temperature (508). In the example method of FIG. 5, the upper level inlet temperature (508) represents a temperature of inlet air measured by an inlet temperature sensor (504) located by the upper portion of the rear door heat exchanger (218). In the example method of FIG. 5, the inlet air represents air that has not been passed through the rear door heat exchanger (218).

In the example method of FIG. 5, determining (205) a temperature differential between two temperature sensors (202, 216) in the rear door heat exchanger (218) can therefore be carried out by subtracting the upper level exhaust temperature (506) from the upper level inlet temperature (508). In such an example, passing air through the rear door heat exchanger (218) should reduce the temperature of the air. As such, if the upper level exhaust temperature (506) is not significantly less that the upper level inlet temperature (508), this is an indication that the rear door heat exchanger (218) may not be working properly. As such, comparing the temperature differential between the upper level exhaust temperature (506) and the upper level inlet temperature (508) may therefore reveal whether the rear door heat exchanger (218) may not be working properly.

Applicants note that in the example of FIG. 5, corrective action is depicted as being taken (212) in the event that the temperature differential is greater than a threshold. In the example of FIG. 5, however, the higher the temperature differential is, the better the rear door heat exchanger (218) is working as air is getting cooled as it passes through. In such an example, corrective action may be taken if the temperature differential is less than the predetermined threshold.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of improving the operating efficiency of a rear door heat exchanger, the method comprising:
   determining, by a ventilation management module, a temperature differential between two temperature sensors in the rear door heat exchanger, the temperature differential indicative of cooling efficiency in the rear door heat exchanger;
   determining, by the ventilation management module, whether the temperature differential is greater than a predetermined threshold; and
   responsive to determining that the temperature differential is greater than the predetermined threshold, taking corrective action by the ventilation management module.

2. The method of claim 1 wherein determining the temperature differential between two temperature sensors in the rear door heat exchanger further comprises:
   determining, by the ventilation management module, an upper level air temperature, wherein the upper level air temperature represents the exhaust air temperature measured by a temperature sensor located by the upper portion of the rear door heat exchanger; and
   determining, by the ventilation management module, a lower level air temperature, wherein the lower level air temperature represents the exhaust air temperature measured by a temperature sensor located by the lower portion of the rear door heat exchanger.

3. The method of claim 1 wherein determining the temperature differential between two temperature sensors in the rear door heat exchanger further comprises:
   determining, by the ventilation management module, an upper level tube temperature, wherein the upper level tube temperature represents the temperature measured by a temperature sensor located on a tube in the upper portion of the rear door heat exchanger; and
   determining, by the ventilation management module, a lower level tube temperature, wherein the lower level tube temperature represents the tube temperature measured by a temperature sensor located on a tube in the lower portion of the rear door heat exchanger.

4. The method of claim 1 wherein determining the temperature differential between two temperature sensors in the rear door heat exchanger further comprises:
   determining, by the ventilation management module, an upper level exhaust temperature, wherein the upper level exhaust temperature represents a temperature of exhaust air measured by an outlet temperature sensor located by the upper portion of the rear door heat exchanger; and
   determining, by the ventilation management module, an upper level inlet temperature, wherein the upper level inlet temperature represents a temperature of inlet air measured by an inlet temperature sensor located by the upper portion of the rear door heat exchanger.

5. The method of claim 1 wherein taking corrective action by the ventilation management module further comprises automatically bleeding trapped air from the top of the rear door heat exchanger.

6. The method of claim 1 wherein taking corrective action by the ventilation management module further comprises sending an alert to a system manager.

7. The method of claim 1 wherein taking corrective action by the ventilation management module includes throttling computing components located by the upper portion of the rear door heat exchanger.

8. The method of claim 1 wherein taking corrective action by the ventilation management module includes powering off computing components located by the upper portion of the rear door heat exchanger.

9. An apparatus for improving the operating efficiency of a rear door heat exchanger, the apparatus comprising a computer processor, a computer memory operatively coupled to the computer processor, the computer memory having disposed within it computer program instructions that, when executed by the computer processor, cause the apparatus to carry out the steps of:
   determining, by a ventilation management module, a temperature differential between two temperature sensors in the rear door heat exchanger, the temperature differential indicative of cooling efficiency in the rear door heat exchanger;
   determining, by the ventilation management module, whether the temperature differential is greater than a predetermined threshold; and
   responsive to determining that the temperature differential is greater than the predetermined threshold, taking corrective action by the ventilation management module.

10. The apparatus of claim 9 wherein determining the temperature differential between two temperature sensors in the rear door heat exchanger further comprises:
    determining, by the ventilation management module, an upper level air temperature, wherein the upper level air temperature represents the exhaust air temperature measured by a temperature sensor located by the upper portion of the rear door heat exchanger; and
    determining, by the ventilation management module, a lower level air temperature, wherein the lower level air temperature represents the exhaust air temperature measured by a temperature sensor located by the lower portion of the rear door heat exchanger.

11. The apparatus of claim 9 wherein determining the temperature differential between two temperature sensors in the rear door heat exchanger further comprises:
    determining, by the ventilation management module, an upper level tube temperature, wherein the upper level tube temperature represents the temperature measured by a temperature sensor located on a tube in the upper portion of the rear door heat exchanger; and
    determining, by the ventilation management module, a lower level tube temperature, wherein the lower level tube temperature represents the tube temperature measured by a temperature sensor located on a tube in the lower portion of the rear door heat exchanger.

12. The apparatus of claim 9 wherein determining the temperature differential between two temperature sensors in the rear door heat exchanger further comprises:
    determining, by the ventilation management module, an upper level exhaust temperature, wherein the upper level exhaust temperature represents a temperature of exhaust air measured by an outlet temperature sensor located by the upper portion of the rear door heat exchanger; and determining, by the ventilation management module, a upper level inlet temperature, wherein the upper level inlet temperature represents a temperature of inlet air measured by an inlet temperature sensor located by the upper portion of the rear door heat exchanger.

13. The apparatus of claim 9 wherein taking corrective action by the ventilation management module further comprises automatically bleeding trapped air from the top of the rear door heat exchanger.

14. The apparatus of claim 9 wherein taking corrective action by the ventilation management module further comprises sending an alert to a system manager.

15. The apparatus of claim 9 wherein taking corrective action by the ventilation management module includes throttling computing components located by the upper portion of the rear door heat exchanger.

16. The apparatus of claim 9 wherein taking corrective action by the ventilation management module includes powering off computing components located by the upper portion of the rear door heat exchanger.

17. A computer program product for improving the operating efficiency of a rear door heat exchanger, the computer program product disposed upon a non-transitory computer readable medium, the computer program product comprising computer program instructions that, when executed, cause a computer to carry out the steps of:

determining, by a ventilation management module, a temperature differential between two temperature sensors in the rear door heat exchanger, the temperature differential indicative of cooling efficiency in the rear door heat exchanger;

determining, by the ventilation management module, whether the temperature differential is greater than a predetermined threshold; and responsive to determining that the temperature differential is greater than the predetermined threshold, taking corrective action by the ventilation management module.

18. The computer program product of claim 17 wherein determining the temperature differential between two temperature sensors in the rear door heat exchanger further comprises:

determining, by the ventilation management module, an upper level air temperature, wherein the upper level air temperature represents the exhaust air temperature measured by a temperature sensor located by the upper portion of the rear door heat exchanger; and determining, by the ventilation management module, a lower level air temperature, wherein the lower level air temperature represents the exhaust air temperature measured by a temperature sensor located by the lower portion of the rear door heat exchanger.

19. The computer program product of claim 17 wherein determining the temperature differential between two temperature sensors in the rear door heat exchanger further comprises:

determining, by the ventilation management module, an upper level tube temperature, wherein the upper level tube temperature represents the temperature measured by a temperature sensor located on a tube in the upper portion of the rear door heat exchanger; and determining, by the ventilation management module, a lower level tube temperature, wherein the lower level tube temperature represents the tube temperature measured by a temperature sensor located on a tube in the lower portion of the rear door heat exchanger.

20. The computer program product of claim 17 wherein determining the temperature differential between two temperature sensors in the rear door heat exchanger further comprises:

determining, by the ventilation management module, an upper level exhaust temperature, wherein the upper level exhaust temperature represents a temperature of exhaust air measured by an outlet temperature sensor located by the upper portion of the rear door heat exchanger; and determining, by the ventilation management module, a upper level inlet temperature, wherein the upper level inlet temperature represents a temperature of inlet air measured by an inlet temperature sensor located by the upper portion of the rear door heat exchanger.

21. The computer program product of claim 17 wherein taking corrective action by the ventilation management module further comprises automatically bleeding trapped air from the top of the rear door heat exchanger.

22. The computer program product of claim 17 wherein taking corrective action by the ventilation management module further comprises sending an alert to a system manager.

23. The computer program product of claim 17 wherein taking corrective action by the ventilation management module includes throttling computing components located by the upper portion of the rear door heat exchanger.

24. The computer program product of claim 17 wherein taking corrective action by the ventilation management module includes powering off computing components located by the upper portion of the rear door heat exchanger.

25. The computer program product of claim 17 wherein the computer readable medium further comprises a computer readable storage medium.

* * * * *